(12) United States Patent
Kobayashi et al.

(10) Patent No.: US 8,142,688 B2
(45) Date of Patent: Mar. 27, 2012

(54) CONDUCTIVITY VARIABLE COMPOSITION, CONDUCTIVITY VARIABLE LAMINATED BODY, AND CONDUCTIVE PATTERN FORMED BODY

(75) Inventors: Yoshihiro Kobayashi, Tokyo (JP); Kiyoshi Itoh, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 11/390,663

(22) Filed: Mar. 28, 2006

(65) Prior Publication Data

US 2006/0222889 A1 Oct. 5, 2006

(30) Foreign Application Priority Data

Mar. 29, 2005 (JP) ................. 2005-095901

(51) Int. Cl.
*H01B 1/02* (2006.01)
(52) U.S. Cl. ............... 252/520.2; 252/511; 252/518.1; 428/403; 428/690
(58) Field of Classification Search .............. 252/500, 252/511, 518.1, 520.2; 430/5, 192; 156/273.2; 427/485, 180; 424/59; 524/439; 428/403, 428/690; 361/56; 338/22
See application file for complete search history.

(56) References Cited

U.S. PATENT DOCUMENTS

| | | | | |
|---|---|---|---|---|
| 6,099,897 | A * | 8/2000 | Sayo et al. ............ | 427/180 |
| 6,264,785 | B1 * | 7/2001 | Ikeda ............... | 156/273.3 |
| 6,620,343 | B1 * | 9/2003 | Blok et al. ............ | 252/511 |
| 2003/0008217 | A1 * | 1/2003 | Kobayashi ............ | 430/5 |
| 2003/0099897 | A1 * | 5/2003 | Fedynyshyn ............ | 430/192 |
| 2003/0129321 | A1 * | 7/2003 | Aoki ............... | 427/458 |
| 2003/0146019 | A1 | 8/2003 | Hirai | |
| 2003/0232286 | A1 * | 12/2003 | Watanabe et al. ............ | 430/315 |
| 2004/0041683 | A1 * | 3/2004 | Tosaka et al. ............ | 338/22 R |
| 2004/0043334 | A1 * | 3/2004 | Kobayashi et al. ............ | 430/315 |
| 2004/0067208 | A1 * | 4/2004 | Lennon et al. ............ | 424/59 |
| 2004/0151910 | A1 * | 8/2004 | Koller et al. ............ | 428/403 |
| 2005/0057867 | A1 * | 3/2005 | Harris et al. ............ | 361/56 |
| 2005/0112810 | A1 * | 5/2005 | Kobayashi ............ | 438/182 |
| 2006/0019076 | A1 * | 1/2006 | Kim et al. ............ | 428/209 |
| 2006/0154070 | A1 * | 7/2006 | Wakiya et al. ............ | 428/403 |
| 2006/0211802 | A1 * | 9/2006 | Asgari ............... | 524/439 |

FOREIGN PATENT DOCUMENTS

| | | |
|---|---|---|
| EP | 1 500 978 A2 | 1/2005 |
| GB | 1069568 A | 5/1967 |
| GB | 2332985 A | 7/1999 |
| JP | 3-247662 A * | 11/1991 |
| JP | 11249299 A | 9/1999 |
| JP | 2000-249821 * | 9/2000 |
| JP | 2001-506393 A | 5/2001 |
| JP | 2003298209 A | 10/2003 |
| JP | 2003-327920 A | 11/2003 |
| JP | 2004-143571 A | 5/2004 |
| JP | 2004-302086 * | 10/2004 |
| JP | 2005064124 A | 3/2005 |
| WO | 96/08047 A2 | 3/1996 |

* cited by examiner

*Primary Examiner* — Khanh Tuan Nguyen
(74) *Attorney, Agent, or Firm* — Ladas & Parry LLP

(57) ABSTRACT

The present disclosure provides a conductive pattern formed body with a conductive pattern formed efficiently and highly precisely in a simple process, a conductivity variable laminated body used for formation of the conductive pattern, and the like. The disclosure provides a conductivity variable composition characterized by containing insulating particle including a conductive inorganic material and an organic material adhered on the circumference of the conductive inorganic material, and a photocatalyst.

1 Claim, 2 Drawing Sheets

FIG. 1
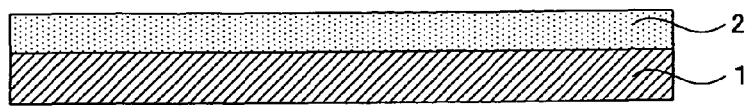
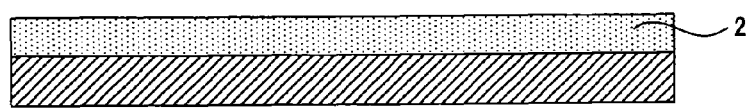
FIG. 2A
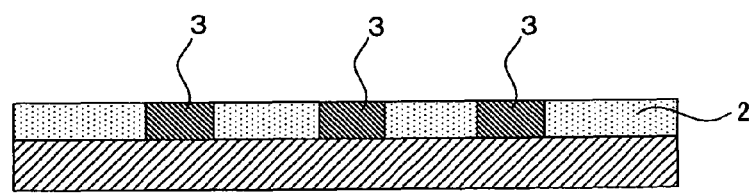
FIG. 2B
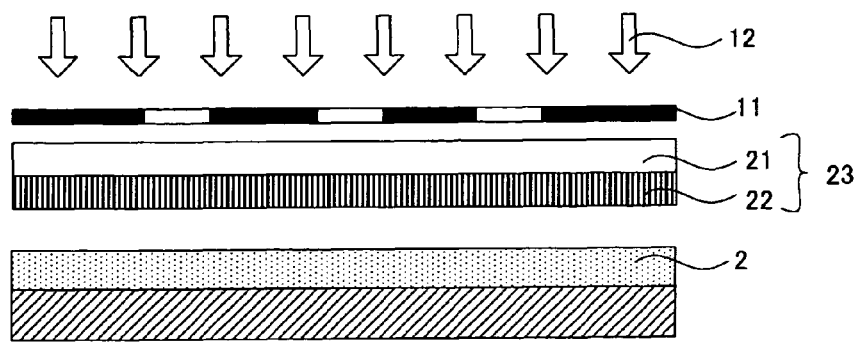
FIG. 3A
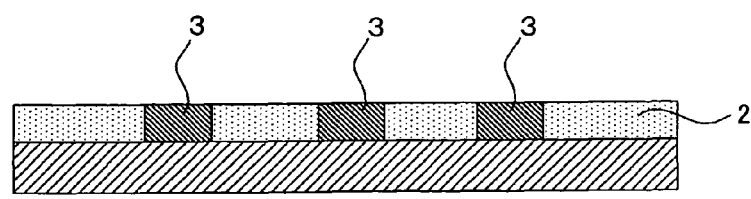
FIG. 3B

CONDUCTIVITY VARIABLE COMPOSITION, CONDUCTIVITY VARIABLE LAMINATED BODY, AND CONDUCTIVE PATTERN FORMED BODY

BACKGROUND OF THE INVENTION

1. Field of the Invention

The present invention relates to a conductive pattern formed body having a highly precise conductive pattern, to be used for formation of for example an organic electroluminescent (hereinafter it is also referred to as "EL") element and a wiring substrate, a conductivity variable laminated body which is capable of easily forming the conductive pattern formed body or the like.

2. Description of the Related Art

Conventionally, a photolithography method, a mask deposition method or the like has been generally used for formation of a conductive pattern of a conductive pattern formed body used for a wiring substrate or the like. However, according to the above-mentioned photolithography method, various processes such as; a process of forming a metal layer on a substrate, a process of forming a photoresist layer on a metal layer, a process of exposing the photoresist layer, a process of developing the photoresist layer and a process of etching the metal layer, are needed. Therefore, a problem is involved in that the production method is complicated. Moreover, since the above-mentioned metal layer is formed by in general a CVD, sputtering or the like so as to require vacuum based equipment and equipment capable of carrying out the high temperature treatment, and thus a problem is involved in that the burden of the equipment cost, the running cost or the like is extremely heavy. Furthermore, another problem is also involved in terms of the environment in that the waste liquid generated in a large quantity at the time of the development is hazardous so as to require the process before discharging the same to the outside or the like.

Moreover, according to the above-mentioned mask deposition method, since the electrode material or the like needs to be deposited, a problem is involved in that vacuum based equipment or the like is needed so that the burden of the equipment cost, the running cost or the like is heavy while also, the productivity is low.

Then, a conductive pattern formed body with a conductive pattern formed efficiently and highly precisely in a simple process, a conductivity variable laminated body used for formation of the conductive pattern, and the like are desired.

SUMMARY OF THE INVENTION

The present invention provides a conductivity variable composition characterized by containing an insulating particle including a conductive inorganic material and an organic material adhered on the circumference of the conductive inorganic material, and a photocatalyst.

According to the present invention, since the above-mentioned insulating particle has an organic material adhered on the circumference of a conductive inorganic material, particles having the insulation property can be provided so that a conductivity variable composition can be provided without the conductivity. Moreover, since a photocatalyst is contained in the above-mentioned conductivity variable composition, the above-mentioned organic material can be eliminated from the circumference of the above-mentioned conductive inorganic material by an action of the photocatalyst by directing the energy to the conductivity variable composition so that the conductivity variable composition can be provided with the conductivity. Therefore, according to the present invention, a conductivity variable composition capable of easily changing the conductivity by the energy irradiation can be provided.

Further, the present invention provides a conductivity variable laminated body characterized by comprising a base material, and a conductivity variable layer formed on the base material, in which the insulating particle including a conductive inorganic material and an organic material adhered on the circumference of the conductive inorganic material is contained, to realize the conductivity by an action of the photocatalyst accompanied by the energy irradiation.

According to the present invention, since the above-mentioned conductivity variable layer contains the above-mentioned insulating particle, a layer having the insulation property can be provided. Moreover, since the above-mentioned organic material can be eliminated from the circumference of the conductive inorganic material of the above-mentioned insulating particle by applying an action of the photocatalyst accompanied by the energy irradiation to the conductivity variable layer, the conductivity can be realized in the conductivity variable layer. Therefore, by applying an action of the photocatalyst in a pattern to the above-mentioned conductivity variable layer, a conductive pattern and an insulating pattern can be easily formed. Thereby, for example a wiring of a wiring substrate or the like can be formed highly precisely.

In the above-mentioned invention, the above-mentioned conductivity variable layer may contain a photocatalyst. Thereby, the conductivity of the conductivity variable layer can be easily changed by an action of the photocatalyst in the conductivity variable layer by directing the energy to the above-mentioned conductivity variable layer.

Moreover, the present invention provides a conductive pattern formed body, characterized in that the conductivity variable layer of the above-mentioned conductive variable laminated body comprises a conductive pattern having the conductivity and an insulating pattern having the insulating property.

According to the present invention, since the conductivity variable layer has the above-mentioned conductive pattern and the insulating pattern, it can be used for various wiring substrates, EL elements or the like by utilizing the conductivity and the insulating property of the above-mentioned conductive pattern and insulating pattern.

The present invention provides an organic electroluminescent element characterized by comprising an organic electroluminescent layer formed on the conductive pattern formed body.

According to the present invention, since the organic EL layer is formed on the above-mentioned conductive pattern formed body having a conductive pattern, the electric characteristic of the organic EL element can be provided preferably. Here, in general, in the case the conductivity of the organic EL element entire surface is improved, at the time of carrying out the moving video image display, the other pixels other than the designated pixels may also emit a light beam. However, according to the present invention, the conductive pattern can be formed so as to improve the conductivity for each of the above-mentioned pixels so that an organic EL element capable of emitting a light beam in a highly precise pattern can be provided. Moreover, since the photocatalyst is contained in the above-mentioned conductivity variable layer, a conductivity variable layer having the function of transporting the electron or the hole can be provided. Therefore, it is advantageous in that the above-mentioned conductivity variable layer can be used as a hole transporting layer or an electron transporting layer.

According to the present invention, it is advantageous in that a conductivity variable composition capable of easily realizing the conductivity by directing the energy can be provided.

BRIEF DESCRIPTION OF THE DRAWINGS

FIG. 1 is schematic cross-sectional view showing an example of a conductivity variable laminated body of the present invention.

FIGS. 2A to 2B are an explanatory diagram for explaining an example of a method for patterning a conductivity variable laminated body of the present invention.

FIGS. 3A to 3B are another explanatory diagram for explaining an example of a method for patterning a conductivity variable laminated body of the present invention.

DETAILED DESCRIPTION OF THE INVETNION

Figure 4:
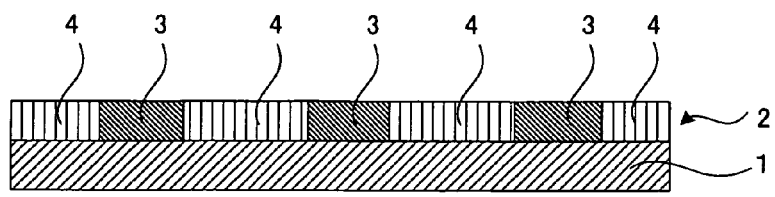
FIG. 4 is a schematic cross-sectional view showing an example of a conductive pattern formed body of the present invention.

The present invention relates to a conductive pattern formed body having a highly precise conductive pattern, to be used for formation of for example an organic EL element or a wiring substrate, a conductivity variable laminated body capable of easily forming the conductive pattern formed body, or the like. Hereinafter each will be explained separately.

A. Conductivity Variable Composition First, the conductivity variable composition of the present invention will be explained. The conductivity variable composition of the present invention contains an insulating particle containing a conductive inorganic material and an organic material adhered on the circumference of the above-mentioned conductive inorganic material, and a photocatalyst.

In the present invention, since the organic material is adhered on the circumference of the conductive inorganic material, the insulating particle can be provided without the conductivity, and the conductivity variable composition can be provided without the conductivity. Moreover, since the conductivity variable composition contains a photocatalyst, by directing the energy to the above-mentioned conductivity variable composition, the action of the photocatalyst can cut off the bond between the conductive inorganic material and the organic material or the like, can decompose the above-mentioned organic material, or the like. Thereby, the organic material adhered on the circumference of the conductive inorganic material can be eliminated so as to expose the conductive inorganic material so that the conductivity can be realized in the conductivity variable composition.

Therefore, according to the present invention, the conductivity can be realized easily in the above-mentioned conductivity variable composition by the energy irradiation. Thereby, the conductivity variable composition of the present invention can be used in the various applications such as production of the wiring substrate.

Hereinafter, the conductivity variable composition of the present invention will be explained in detail for each configuration.

1. Insulating Particle

First, the insulating particle used in the present invention will be explained. The insulating particle used in the present invention contains a conductive inorganic material, and an organic material adhered on the circumference of the conductive inorganic material. Here, in the present invention, "the organic material adhered on the circumference of the conductive inorganic material" denotes that the organic material is disposed on the circumference of the conductive inorganic material so as to inhibit the conductivity of the conductive inorganic material to the degree that the insulating particle is not provided with the conductivity. Moreover, at the time, the above-mentioned organic material is disposed on the circumference of the conductive inorganic material by the strength and the density to the degree that it is eliminated easily from the circumference of the conductive inorganic material by the action of the photocatalyst accompanied by the energy irradiation. Such a bond between the conductive inorganic material and the organic material in general is generated by the intermolecular force, the carbon-metal bond, the metal-hetero element bond, or the like.

Here, it is preferable that the above-mentioned insulating particle are contained in the conductivity variable composition by about 50% by weight to 95% by weight; more preferably, by about 75% by weight to 95% by weight; and particular preferably, by about 90% by weight to 95% by weight. Since the insulating particle is contained by the above-mentioned range, the conductivity of the conductivity variable composition can be changed at the time of directing the energy to the conductivity variable composition.

Moreover, the particle size of the above-mentioned insulating particle can be selected optionally according to the application of the conductivity variable composition, the kind of the conductive inorganic material and organic material to be described later, or the like. In general, it is preferably about 10 nm to 100 nm, and particular preferably, about 10 nm to 50 nm. Thereby, a minute conductive pattern can be formed using the conductivity variable composition of the present invention.

Hereinafter, the conductive inorganic material, and the organic material contained in such insulating particle will be explained.

a. Conductive Inorganic Material

The conductive inorganic material used in the present invention is not particularly limited as long as it is an inorganic substance having the conductivity, and not to be decomposed or the like by the action of the photocatalyst accompanied by the energy irradiation. As such a conductive inorganic material, for example, a metal, an oxide thereof or the like can be presented. Specifically, a nickel, a gold, a silver, a copper, an aluminum, a zinc, a cobalt, a tin and an alloy thereof, a metal oxide thereof or the like can be presented. In particular, it is preferable to use a gold, a silver or a copper for obtaining a high conductivity.

Moreover, as the above-mentioned conductive inorganic material, it is generally preferable to use those having about a 10 nm to 70 nm particle size, in particular, those having about 10 nm to 50 nm particle size. Thereby, the particle size of the insulating particle can be provided in the above-mentioned range.

Moreover, the shape of the above-mentioned conductive inorganic material is not particularly limited, and it can be selected optionally according to the kind or the like of the conductive inorganic material. For example, it can be spherical, short fiber-like, columnar, or the like.

b. Organic Material

Next, the organic material used in the present invention will be explained. The organic material used in the present invention is not particularly limited as long as it has the following features; it has no conductivity, it can be adhered on the circumference of the above-mentioned conductive inorganic material, and it is to be eliminated easily from the surface of the conductive inorganic material by the action of the photocatalyst accompanied by the energy irradiation and the heating operation as the post process while also to be desorbed as a gas.

As such an organic material, a low molecular material such as a pyrocarbonate dibutyl, a triethyl amine, an acetyl acetone, and a pentane thiol, an oligomer having a repeated structure thereof, a dendron, a dendrimer, or the like can be presented. Moreover, in the present invention, out of the above-mentioned, it is particularly preferable to use the pyrocarbonate dibutyl for its high reactivity.

The content ratio of the above-mentioned organic material in the insulating particle with respect to the above-mentioned conductive inorganic material contained in the insulating particle is about 50% by weight or less; more preferably about 25% by weight or less; and particular preferably about 5% by weight or less. Since the content of the above-mentioned organic material is in the above-mentioned range, the insulating property of the insulating particle can be made higher.

In the present invention, as the method for adhering the above-mentioned organic material on the circumference of the conductive inorganic material a commonly carried out method, for example, a method of the surface covering of the inorganic pigment, or the surface decoration, can be used. However, for example, a method of adhering the organic material on the circumference of the conductive inorganic material by a weak bonding force such as a coordinate bond and an electric interaction, can also be used.

2. Photocatalyst

Next, the photocatalyst used in the present invention will be explained. The photocatalyst used in the present invention is not particularly limited as long as it is excited by the energy irradiation so as to eliminate the above-mentioned organic material from the circumference of the above-mentioned conductive inorganic material.

Although the action mechanism by the photocatalyst represented by titanium dioxide to be described later is not always clear, it is considered that the photocatalyst generates the oxidation reduction reaction by the energy irradiation so as to generate the active oxygen species such as the super oxide ($O_2$—) and a hydroxyl radical ($\cdot OH$) so that the generated active oxygen species influence the chemical structure of the organic substance. In the present invention, the carrier is considered to function on the bond between the above-mentioned conductive inorganic material and the organic material, or the organic material itself.

As for the photocatalyst, those known as photo semiconductors, for example a metallic oxide, such as a titanium oxide ($TiO_2$), a zinc oxide ($ZnO$), a tin oxide ($SnO_2$), a strontium titanate ($SrTiO_3$), a tungsten oxide ($WO_3$), a bismuth oxide ($Bi_2O_3$), and an iron oxide ($Fe_2O_3$) can be presented. One or two or more kinds as a mixture can be selected and used from them. Among these, in the present embodiment, a titanium oxide can be used preferably. The titanium oxide is advantageous that it has high band gap energy, it is chemically stable without the toxicity, and it can be obtained easily.

The titanium oxides include those of the anatase type and the rutile type belonging to the tetragonal system and those of the brookite type belonging to the ortho rhombic system. In this invnetion, either one can be used, or furthermore, these can be used as a mixture. Among these, in the present invention, it is preferable to use the anatase type titanium oxide. The anatase type titanium oxide has a 380 nm or less excitation wavelength. As the anatase type titanium oxide, for example, a hydrochloric acid deflocculation type anatase type titania sol (STS-02 (average particle diameter 7 nm) manufactured by ISHIHARA SANGYO KAISHA, LTD., ST-K01 manufactured by ISHIHARA SANGYOKAISHA, LTD.), oranitric acid deflocculation type anatase type titania sol (TA-15 (average particle diameter 12 nm) manufactured by Nissan Chemical Industries, Ltd.) can be presented.

Moreover, it is known that the brookite type titanium oxide has a high photocatalyst activity so that it can be used preferably.

Moreover, the shape of the above-mentioned photocatalyst is not particularly limited, and it can be selected optionally according to the kind or the like of the photocatalyst. Moreover, the particle size of the photocatalyst is preferably about 10 nm to 100 nm; more preferably about 10 nm to 70 nm; and particular preferably about 10 nm to 50 nm. Thereby, it can influence the above-mentioned insulating particle efficiently in the conductivity variable composition.

In the present invention, it is preferable that the photocatalyst is contained in the conductivity variable composition by about 5% by weight to 95% by weight; more preferably by about 5% by weight to 50% by weight; and particular preferably by about 5% by weight to 20% by weight. Thereby, the above-mentioned organic material can be eliminated efficiently from the circumference of the conductive inorganic material by the energy irradiation so that the conductive inorganic material with the energy irradiation can realize the conductivity.

It can be confirmed that the photocatalyst is contained in the conductivity variable composition by the X ray photoelectron spectrometry, the Rutherford back scattering spectrometry, nuclear magnetic resonance spectrometry, the mass spectrometry or a combination of thereof.

3. Conductivity Variable Composition

Next, the conductivity variable composition of the present invention will be explained. The conductivity variable composition of the present invention contains the above-mentioned insulating particle, and the above-mentioned photocatalyst, to realize the conductivity by the energy irradiation.

Such a conductivity variable composition may either be powdery, or a solution with the above-mentioned insulating particle and photocatalyst dispersed or the like. Moreover, it may be solidified in a predetermined shape or the like.

Moreover, as needed, the conductivity variable composition may optionally contain the materials other than the above-mentioned insulating particle and photocatalyst, such as a binder, a pH adjusting agent, a dispersing agent, a solvent, and the like, not to be decomposed by the action of the photocatalyst accompanied by the energy irradiation.

In the present invention, it is particularly preferable to contain a binder. Thereby, at the time of forming for example the conductivity variable laminated body to be described later or the like, using the conductivity variable composition, the strength of the conductivity variable layer as a film of the conductivity variable composition can be improved.

As such a binder, it is preferably a compound having a high bond energy that the main skeleton thereof is not decomposed by photoexcitation of the photocatalyst, and organopolysiloxane and the like can be cited as an example. Moreover, in the present invention, as the binder, one with the characteristic changed by the action of the photocatalyst accompanied by the energy irradiation or the like can be used as well. Thereby, at the time of directing the energy to the above-mentioned conductivity variable composition, not only the conductivity is realized by the conductivity variable composition but also the characteristic thereof can be changed. Such a characteristic change is not particularly limited. For example, it may be the wettability change by the action of the photocatalyst accompanied by the energy irradiation, or the adhesion property change by the action of the photocatalyst.

In the present invention, it is particularly preferable to use one having the wettability change by the action of the photocatalyst as the above-mentioned binder. Thereby, the wettability of the above-mentioned conductivity variable layer can also be changed by forming a conductivity variable layer using the conductivity variable composition and directing the energy to the conductivity variable layer. Therefore, various functional parts or the like can also be formed on the region with the energy irradiation, that is, on the pattern having the conductivity, utilizing the above-mentioned wettability difference. As such a binder to have the wettability change by the action of the photocatalyst, for example, an organopolysiloxane containing a fluoro alkyl group described in the Japanese Patent Application Laid-Open No. 2000-249821, or the like can be presented.

Moreover, the above-mentioned pH adjusting agent and dispersing agent are not particularly limited as long as they can prevent aggregation of the above-mentioned photocatalyst or insulating particle so that the pH adjusting agent, dispersing agent or the like commonly used can be used.

In the present invention, the above-mentioned insulating material may also provides the function of a dispersing agent, a binder or the like.

B. Conductivity Variable Laminated Body

Next, the conductivity variable laminated body of the present invention will be explained. The conductivity variable laminated body of the present invention comprises a base material, and a conductivity variable layer formed on the base material containing an insulating particle which includes a conductive inorganic material and an organic material adhered on the circumference of the conductive inorganic material, to realize the conductivity by the action of the photocatalyst accompanied by the energy irradiation.

For example as shown in FIG. 1, the conductivity variable laminated body of the present invention has a base material 1, and a conductivity variable layer 2 formed on the base material 1, wherein the conductivity variable layer 2 contain the above-mentioned insulating particle so as to have the characteristic change by the action of the photocatalyst accompanied by the energy irradiation.

According to the present invention, since the above-mentioned conductivity variable layer contains the insulating particle, it can provide a layer having the insulating property. Moreover, by providing an action of the photocatalyst accompanied by the energy irradiation to the conductivity variable layer, the above-mentioned organic material can be eliminated from the circumference of the conductive inorganic material of the insulating particle so that the conductivity variable layer can easily have the conductivity. Therefore, according to the present invention, a conductive region and an insulating region can be formed by providing an action of the above-mentioned photocatalyst in a pattern on the conductivity variable layer without the need of a complicated process. Thereby, a conductivity variable laminated body capable of forming a highly precise conductive pattern can be provided.

Hereinafter, the conductivity variable laminated body of the present invention will be explained in detail for each configuration.

1. Conductivity Variable Layer

First, the conductivity variable layer used in the present invention will be explained. The conductivity variable layer used in the present invention is to be formed on the base material to be described later, and it contains the insulating particle including a conductive inorganic material and an organic material adhered on the circumference of the conductive inorganic material so as to realize the conductivity by the action of the photocatalyst accompanied by the energy irradiation.

In the present invention, it is preferable that the volume resistance of the above-mentioned conductivity variable layer is $1.0 \times 10^{11}$ Ωcm or more, in particular, $1.0 \times 10^{12}$ Ωcm or more. Thereby, the insulating property of the conductivity variable layer before realizing the conductivity can be made higher so that the conductivity variable laminated body of the present invention can be used for the various applications.

Moreover, it is preferable that the volume resistance of the above-mentioned conductivity variable layer after realizing the conductivity is $1.0 \times 10^{10}$ Ωcm or less, in particular, $1.0 \times 10^{5}$ Ωcm or less. Thereby, the conductivity of the region with the conductivity realized can be made higher so that a conductivity variable laminated body to be used for various applications can be provided. The measurement of the volume resistance is carried out using a resistance value measuring device having a plurality of terminals by forming a film of a test body on a substrate provided with electrodes and calculating the electric resistance value between the electrodes. In the case the film thickness is thin, the surface resistance value can be converted to the volume resistance value.

Here, in the present invention, the above-mentioned conductivity variable layer is not particularly limited as long as it contains the above-mentioned insulating particle. For example, a photocatalyst may be contained in the conductivity variable layer (first embodiment), or a photocatalyst may not be contained in the conductivity variable layer (second embodiment). Hereinafter, the conductivity variable layer in each embodiment will be explained.

(First Embodiment)

First, the case with the photocatalyst contained in the above-mentioned conductivity variable layer will be explained. In this case, the conductivity variable layer is provided as a layer containing at least an insulating particle including a conductive inorganic material and an organic material adhered on the circumference of the conductive inorganic material, and a photocatalyst.

In this embodiment, for example as shown in FIGS. 2A to 2B, by directing the energy 12 using for example a photo mask 11 or the like (FIG. 2A), the organic material adhered on the circumference of the conductive inorganic material of the above-mentioned insulating particle can be eliminated by the action of the photocatalyst in the conductivity variable layer 2 so that a conductive pattern 3 with the conductivity realized can be formed in the conductivity variable layer 2 in the region with the energy 12 irradiated (FIG. 2B).

As such a conductivity variable layer containing the photocatalyst, those having the above-mentioned "conductivity variable composition" formed as a film or the like can be used. As to the method for forming the conductivity variable composition as a film, it can be formed by preparing a coating solution by dissolving or dispersing the conductivity variable composition and the other additives in a solvent, and coating the coating solution onto the above-mentioned base material, or the like.

The coating operation can be carried out by a known coating method such as spin coating, spray coating, dip coating, roll coating and bead coating. Moreover, in the case an ultraviolet ray curing type component is contained in the above-mentioned conductivity variable composition as the binder, the conductivity variable layer can be formed by carrying out the curing process of directing an ultraviolet ray.

Since the insulating particle contained in the above-mentioned conductivity variable layer, the photocatalyst, the binder, and the other additives or the like, are same as those explained in the above-mentioned item of "A. Conductivity variable composition", the detailed explanation is not repeated here.

Moreover, in this embodiment, the film thickness of the above-mentioned conductivity variable layer is preferably about 10 nm to 10 μm; more preferably about 10 nm to 1 μm; and particular preferably about 10 nm to 100 nm. Thereby, the conductivity of the conductivity variable layer can be easily changed by the energy irradiation.

(Second Embodiment)

Next, the case with the above-mentioned conductivity variable layer not containing the photocatalyst will be explained. In this case, the conductivity variable layer is not particularly limited as long as it is a layer containing an insulating particle including a conductive inorganic material and an organic material adhered on the circumference of the conductive inorganic material. For example, it may be a layer having only the insulating particle explained in the above-mentioned item of "A. Conductivity variable composition", or a layer containing the above-mentioned insulating particle and a binder or the like.

In this embodiment, for example as shown in FIGS. 3A to 3B, a photocatalyst containing layer side substrate 23 having abase body, 21 and a photocatalyst containing layer 22 containing at least a photocatalyst and formed on the base body 21 is prepared, and in a state with the photocatalyst containing layer 22 of the photocatalyst containing layer side substrate 23 and the conductivity variable layer 2 disposed facing with each other, the energy 12 is directed using for example a photo mask 11 or the like (FIG. 3A). Thereby, the organic material adhered on the circumference of the conductive inorganic material of the above-mentioned insulating particle by the action of the photocatalyst in the photocatalyst containing layer 22 so that a conductive pattern 3 with the conductivity realized can be formed in the conductivity variable layer 2 in the region with the energy 12 irradiated (FIG. 3B).

Moreover, in this embodiment, it is also possible to form a photocatalyst containing layer containing at least a photocatalyst for example between the conductivity variable layer and the base material so as to realize the conductivity in the above-mentioned conductivity variable layer by the action of the photocatalyst in the photocatalyst containing layer. Such a photocatalyst containing layer may be same as the photocatalyst containing layer used for the above-mentioned photocatalyst containing layer side substrate.

Here, the insulating particle contained in the conductivity variable layer may be same as that explained in the above-mentioned item of "A. conductivity variable composition". Moreover, the binder contained other than the above-mentioned insulating particle is preferably one having a high bonding energy so that the main skeleton is not decomposed by the photo excitation of the above-mentioned photocatalyst. For example, the binders explained in the above-mentioned item of "A. Conductivity variable composition" or the like can be used.

Moreover, it is preferable that the above-mentioned insulating particle are contained in the conductivity variable layer by 50% by weight or more; more preferably by about 75% by weight to 95% by weight; and particular preferably by about 90% by weight to 95% by weight. Thereby, the conductivity can be realized in the conductivity variable layer at the time of directing the energy to the conductivity variable layer in a state where the layer faces to the above-mentioned photocatalyst containing layer.

As to the method for forming the above-mentioned conductivity variable layer in this embodiment, it can be formed by preparing a coating solution by dissolving or dispersing the insulating particle, the binder, the other additives or the like in a solvent, and coating the coating solution onto the above-mentioned base material or the like.

The coating operation can be carried out by a known coating method such as spin coating, spray coating, dip coating, roll coating and bead coating. Moreover, in the case an ultraviolet ray curing type component is contained in the above-mentioned conductivity variable composition as the binder, the conductivity variable layer can be formed by carrying out the curing process by directing an ultraviolet ray.

Moreover, in this embodiment, the film thickness of the conductivity variable layer is preferably about 10 nm to 10 μm; more preferably about 10 nm to 1 μm; and particular preferably about 10 nm to 100 nm. Thereby, the conductivity of the conductivity variable layer can be easily changed by the action of the photocatalyst accompanied by the energy irradiation.

Moreover, since the photocatalyst containing layer or the like, used for patterning the above-mentioned conductivity variable layer or the like will be explained in the item of "C. Conductive pattern formed body" to be described later, the detailed explanation is not repeated here.

2. Base Material

Next, the base material used in the present invention will be explained. The base material used in the present invention is not particularly limited as long as it is a layer capable of forming the above-mentioned conductivity variable layer so that it can be selected optionally according to the application of the conductivity variable laminated body or the like. As such a base material, specifically, a transparent rigid material without flexibility, such as a quartz glass, a pyrex glass (registered trademark), and a synthetic quartz plate, and a transparent flexible material having flexibility, such as a transparent resin film and an optical resin plate, or the like can be presented.

Moreover, the base material may have the surface treatment applied for preventing the alkaline elution, providing the gas barrier property, or another purpose as needed.

An anchor layer may be formed on the base material in order to improve the adhesiveness between the base material surface and the conductivity variable layer. The anchor layer may be made of, for example, a silane-based or titanium-based coupling agent.

The energy transmitting property of the above-mentioned base material can be selected optionally according to the energy irradiating direction at the time of applying the action of the photocatalyst to the conductivity variable layer. For example, in the case the energy is directed from the conductivity variable layer side, the energy transmitting property is not required to the base material. On the other hand, in the case the energy is directed from the base material side, the transmitting property with respect to the energy is required to the base material.

3. Conductivity Variable Laminated Body

Next, the conductivity variable laminated body of the present invention will be explained. The conductivity variable laminated body of the present invention is not particularly limited as long as it comprises the above-mentioned base material and the above-mentioned conductivity variable layer. As needed, another member may be provided optionally such as a light shielding part formed on the base material, or the like.

C. Conductive Pattern Formed Boy

Next, the conductive pattern formed body of the present invention will be explained. The conductive pattern formed body of the present invention has the above-mentioned conductivity variable layer of the conductivity variable laminated body mentioned above including a conductive pattern with the conductivity and an insulating pattern with the insulating property.

For example as shown in FIG. 4, according to the conductive pattern formed body of the present invention, the conductivity variable layer 2 of the conductivity variable laminated body having the base material 1 and the conductivity variable layer 2 as mentioned above includes a conductive pattern 3 with the conductivity and an insulating pattern 4 with the insulating property.

According to the present invention, since the above-mentioned conductive pattern and insulating pattern are provided, a conductive pattern formed body to be used for the various applications, such as the wiring substrate and the organic EL element can be provided, by utilizing the conductivity and the insulating property of the above-mentioned conductive pattern and insulating pattern.

Moreover, according to the present invention, by applying the action of the photocatalyst accompanied by the energy irradiation in pattern to the above-mentioned conductivity variable layer, each pattern can be formed. That is, a conductive pattern can be provided in a region with the conductivity realized by applying the action of the photocatalyst to the conductivity variable layer, and an insulating pattern can be provided in a region with the conductivity unchanged without applying the action of the photocatalyst to the conductivity variable layer. Therefore, according to the present invention, the conductive pattern and insulating pattern can be formed highly precisely by a simple process without the need of special equipment, process or the like so that a conductive pattern formed body preferable also in terms of the production efficiency, the cost or the like can be provided.

Hereinafter, the conductive pattern and insulating pattern of the conductive pattern formed body of the present invention will be explained. Since the base material and the conductivity variable layer used in the present invention are same as those explained in the above-mentioned item of "B. Conductivity variable laminated body", the detailed explanation is not repeated here.

1. Conductive Pattern

First, the conductive pattern formed in the conductivity variable layer in the present invention will be explained. The conductive pattern is a region with the conductivity variable layer having the conductivity, and it is preferably a region having a volume resistance of $1.0 \times 10^{10}$ Ωcm or less, in particular, $1.0 \times 10^{5}$ Ωcm or less. Thereby, the conductive pattern can be used for example as the wiring of a wiring substrate or the like so that the conductive pattern laminated body of the present invention can be used for the various applications.

Moreover, the shape of the conductive pattern can be selected optionally according to the kind, the application or the like of the conductive pattern formed body. The above-mentioned volume resistance can be measured by the above-mentioned method.

2. Insulating Pattern

Next, the insulating pattern formed in the conductivity variable pattern in the present invention will be explained. The insulating pattern is a region with the conductivity variable layer having the insulating property, and it is preferably a region having a volume resistance of $1.0 \times 10^{11}$ Ωcm or more, in particular, $1.0 \times 10^{12}$ Ωcm or more. Thereby, a high quality conductive pattern laminated body with the high insulating property of the insulating pattern can be provided. The above-mentioned volume resistance is a value measured by the above-mentioned method.

Such an insulating pattern is a region without formation of the above-mentioned conductive pattern formed in the above-mentioned conductivity variable layer.

3. Conductive Pattern Formed Body

The conductive pattern formed body of the present invention is not particularly limited as long as the conductivity variable layer of the above-mentioned conductivity variable laminated body has the above-mentioned conductive pattern and insulating pattern. As needed, for example, another member such as a light shielding part may be formed. Moreover, the conductive pattern formed body of the present invention can be used for example for a wiring substrate using the conductive pattern as a wiring, an organic EL element with an organic EL layer formed on the conductive pattern, or the like.

Hereinafter, the method for forming the above-mentioned conductive pattern and insulating pattern in the present invention will be explained.

(Method for Forming the Conductive Pattern and the Insulating Pattern)

The method for forming the conductive pattern and the insulating pattern in the present invention includes the two embodiments. The first embodiment is the case with the photocatalyst contained in the above-mentioned conductivity variable laminated body, and the second embodiment is the case without containing the photocatalyst in the conductivity variable laminated body. Hereinafter, each embodiment will be explained separately.

(1) First Embodiment

First, the method for forming the conductive pattern and the insulating pattern in the case the photocatalyst is contained in the above-mentioned conductivity variable laminated body will be explained. In the case the photocatalyst is contained in the conductivity variable laminated body, that is, the photocatalyst is contained in the above-mentioned conductivity variable layer, or the photocatalyst containing layer is formed between the conductivity variable layer and the base material, or the like, the conductive pattern and the insulating pattern can be formed by directing an energy in a pattern to the conductivity variable layer of the conductivity variable laminated body.

At the time, the energy to be directed is a concept including irradiation of any energy line as long as it can eliminate the organic material adhered on the circumference of the above-mentioned conductive inorganic material by exciting the above-mentioned photocatalyst so that it is not limited to the irradiation of a visible light beam.

For the energy irradiation, in general, the light wavelength can be set in a range of 400 nm or less, preferably in a range of 150 nm to 380 nm. This is because the preferable photocatalyst used for the conductivity variable layer is a titanium dioxide, and a light having the above-mentioned wavelength is preferable as the energy for activating the photocatalyst function by the titanium dioxide.

As a light source to be used for the energy irradiation, a mercury lamp, a metal halide lamp, a xenon lamp, an excimer lamp, and various other light sources can be presented. Moreover, in addition to the method of executing a pattern irradiation through a photo mask using the light source mentioned above, a method of drawing irradiation of an energy in a pattern using a laser such as an excimer, a YAG, or the like can be used as well.

Moreover, the energy irradiation amount at the time of the energy irradiation is an irradiation amount capable of eliminating the organic material adhered on the conductive inorganic material by the action of the photocatalyst. At the time, the oxidative decomposion power can be increased by directing the energy while heating the conductivity variable layer so that it is preferable in terms of efficiently changing the conductivity. Specifically, it is preferable to heat in a range of 30° C. to 80° C.

Moreover, the direction of the above-mentioned energy irradiation is not particularly limited. For example, it may be from the base material side, or from the conductivity variable layer side.

(2) Second Embodiment

Next, the method for forming the conductive pattern and the insulating pattern in the case the photocatalyst is not contained in the above-mentioned conductivity variable laminated body will be explained. In the case the photocatalyst is not contained in the conductivity variable laminated body, as mentioned above, by directing the energy with the photocatalyst containing layer containing the photocatalyst and the above-mentioned conductivity variable layer disposed facing with each other, the conductive pattern and insulating pattern can be formed.

As to the photocatalyst containing layer side substrate having the photocatalyst containing layer used for the formation of the conductive pattern and the insulating pattern, in general, it may be one including a base body and a photocatalyst containing layer formed on the base body. A light shielding part may be formed on the photocatalyst containing layer or base body. In this case, by directing the energy on the entire surface from the photocatalyst containing layer side substrate, the conductive pattern and the insulating pattern can be formed without using a photomask or the like, and thus it is advantageous. Hereinafter, the base body and the photocatalyst containing layer used for the photocatalyst containing layer side substrate, and the energy irradiation method using the photocatalyst containing layer side substrate will be explained.

a. Photocatalyst Containing Layer

First, the photocatalyst containing layer used for the photocatalyst containing layer side substrate will be explained. The photocatalyst containing layer used in this embodiment is not particularly limited as long as it has a configuration capable of realizing the conductivity in the conductivity variable layer so that it may includes a photocatalyst and a binder, or it may be provided as a film formed with a photocatalyst alone. Moreover, the surface characteristic thereof may either be lyophilic or liquid repellent.

Figure 5:
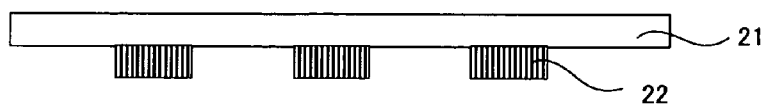
FIG. 5 is a schematic cross-sectional view showing an example of a photocatalyst containing layer side substrate to be used for formation of a conductive pattern formed body of the present invention.

Moreover, for example as shown in FIG. 3A, the photocatalyst containing layer 22 may be formed on the entire surface of the base body 21. Moreover, for example as shown in FIG. 5, the photocatalyst containing layer 22 may be formed in a pattern on the base body 21. Accordingly, by forming the photocatalyst containing layer in a pattern, a photo mask or the like needs not be used at the time of the energy irradiation, and thus it is advantageous. The method for patterning the photocatalyst containing layer is not particularly limited, and thus it may be carried out by for example the photolithography method or the like.

Moreover, the photocatalyst containing layer used in this embodiment may be formed either with a photocatalyst alone, or with a mixture with a binder. Moreover, the photocatalyst and the binder used in this embodiment may be same as the photocatalyst and binder contained in the above-mentioned "A. Conductivity variable composition".

Moreover, the method for forming the photocatalyst containing layer may be same as the method for forming the conductivity variable layer of the above-mentioned "B. conductivity variable laminated body" in the case the photocatalyst containing layer contains a photocatalyst and a binder.

The method for forming the photocatalyst containing layer consists of only the photocatalyst may be a method using a vacuum film-forming method such as sputtering, CVD or vacuum vapor deposition. According to the formation by the vacuum film-forming method, it is possible to form, as an even film, the photocatalyst containing layer which contains only the photocatalyst. In this way, the conductivity of the conductivity variable layer can be evenly varied, and more effectively changed in this case than in the case of using a binder.

Another example of the method for forming the photocatalyst containing layer made only of a photocatalyst, is the following method: in the case that the photocatalyst is, for example, titanium dioxide, amorphous titania is formed on the base material and next fired so as to phase-change the titania to crystalline titania. The amorphous titania used in this case can be obtained, for example, by hydrolysis or dehydration condensation of an inorganic salt of titanium, such as titanium tetrachloride or titanium sulfate, or hydrolysis or dehydration condensation of an organic titanium compound, such as tetraethoxytitanium, tetraisopropoxytitanium, tetra-n-propoxytitanium, tetrabutoxytitanium or tetramethoxytitanium, in the presence of an acid. Next, the resultant is fired at 400° C. to 500° C. so as to be denatured to anatase type titania, and fired at 600° C. to 700° C. so as to be denatured to rutile type titania.

b. Base Body

Next, the base body used in the photocatalyst containing layer side substrate will be explained. The material which constitutes the base body used in the present embodiment is appropriately selected in accordance with the direction of energy irradiation. Such base body may be a member having flexibility, such as a resin film, or may be a member having no flexibility, such as a glass substrate. This is appropriately selected in accordance with the method for the energy irradiation.

An anchor layer may be formed on the base body in order to improve the adhesiveness between the base body surface and the photocatalyst containing layer. The anchor layer may be made of, for example, a silane-based or titanium-based coupling agent.

c. Energy Irradiation

Next, the energy irradiation in this embodiment will be explained. In this embodiment, the conductive pattern and the insulating pattern can be formed on the conductivity variable layer by disposing the above-mentioned conductivity variable layer and the above-mentioned photocatalyst containing layer with a predetermined gap therebetween, and directing the energy from a predetermined direction.

The wording "disposing" mentioned above means that the conductivity variable layer and the photocatalyst containing layer are disposed in the state that the action of the photocatalyst can substantially work to the surface of the conductivity variable layer, and include not only the state that the two layers physically contact each other, but also the state that the two layers are arranged at a given gap. The gap is preferably 200 μm or less.

The above-mentioned gap in the embodiment is more preferably from 0.2 μm to 10 μm, even more preferably from 1 μm to 5 μm since the precision of the pattern to be obtained becomes very good and further the sensitivity of the photocatalyst also becomes high so as to make good the efficiency of the conductivity change of the conductivity variable layer. This range of the gap is particularly effective for the conductivity variable layer small in area, which makes it possible to control the gap with a high precision.

Meanwhile, in the case of irradiating energy onto the conductivity variable layer large in area, for example, 300 mm×300 mm or more in size, it is very difficult to keep a fine gap as described above between the photocatalyst containing layer side substrate and the conductivity variable layer without contacting each other. Accordingly, when the conductivity variable layer has a relatively large area, the gap is preferably in a range of 10 to 100 μm, more preferably in a range of 50 to 75 μm. The limitation of the gap into this range gives an advantageous effect of not causing problems based on a fall in patterning precision such as a problem that a blurred pattern is obtained, or other problems such as a problem that the sensitivity of the photocatalyst deteriorates so that the efficiency of the conductivity change also deteriorates, and further gives an advantageous effect of not causing unevenness in the conductivity change on the conductivity variable layer.

At the time of irradiating energy onto the conductivity variable layer having a relatively large area, in a unit for positioning the photocatalyst containing layer side substrate and the conductivity variable layer precisely inside an energy radiating device, the gap therebetween is set preferably into a range of 10 μm to 200 μm, more preferably into a range of 25 μm to 75 μm. The setting of the gap value into this range makes it possible to arrange the photocatalyst containing layer side substrate and the conductivity variable layer without causing a large drop in patterning precision or in sensitivity of the photocatalyst, and without bringing the photocatalyst containing layer side substrate and the conductivity variable layer into contact with each other.

When the photocatalyst containing layer and the surface of the conductivity variable layer are arranged at a given gap, active oxygen species generated from oxygen and water by the action of the photocatalyst can easily be released. In other words, if the gap between the photocatalyst containing layer and the conductivity variable layer is made narrower than the above-mentioned range, the active oxygen species are not easily released, so as to make the rate for the conductivity change unfavorably small. If the two layers are arranged at a gap larger than the above-mentioned range, it is difficult for the generated active oxygen species to reach the conductivity variable layer. In this case also, the rate for the conductivity change unfavorably becomes small.

In the present embodiment, it is sufficient that such disposed state is to be maintained at least only during the energy irradiation. Furthermore, as for the energy and the like used in the formations of conductivity pattern and the insulating pattern of the present embodiment, they are same as those described in the first embodiment, thus the detailed explanation is omitted here.

D. Organic EL Element

Next, the organic EL element of the present invention will be explained. The organic EL element of the present invention has an organic EL layer formed on the conductive pattern formed body mentioned above.

Figure 6:
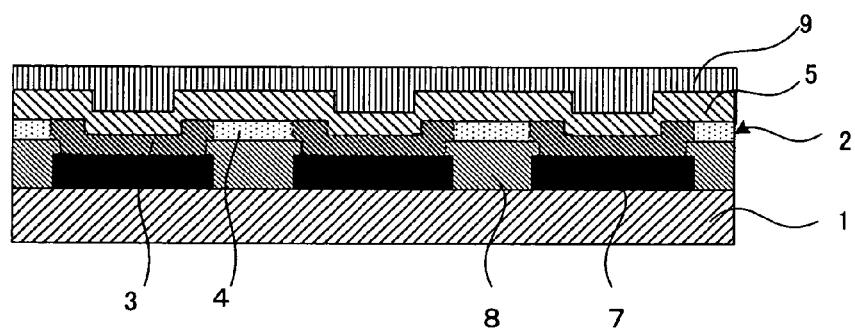
FIG. 6 is a schematic cross-sectional view showing an example of an organic EL element of the present invention.

For example as shown in FIG. 6, the organic EL element of the present invention comprises an organic EL layer 5 formed on a conductive pattern formed body with the above-mentioned conductive pattern 3 and insulating pattern 4 formed. Here, the above-mentioned base material 1 in general has an electrode layer 7 and an insulation layer 8. Moreover, in general, a counter electrode layer 9 is formed on the above-mentioned organic EL layer 5.

According to the present invention, since the light emitting layer is formed on the above-mentioned conductive pattern, the electric characteristic of the organic EL element can be improved. Here, in the case the electronic characteristic of the organic EL element entire surface are improved, at the time of carrying out the moving video image display, the pixels other than the designated pixels may also emit a light beam. However, according to the present invention, since the conductivity can be made higher for each of the above-mentioned pixels, light emission from the pixels other than the designated pixels can be prevented so as to provide a high quality organic EL element.

Moreover, according to the present invention, since the above-mentioned photocatalyst is contained in the above-mentioned conductivity variable layer, the conductivity variable layer may have the function of transporting the electrons or the holes. Therefore, it is advantageous in that the conductivity variable layer can be used as a hole transporting layer or an electron transporting layer.

Hereinafter, each configuration of the organic EL element of the present invention will be explained.

1. Conductivity Variable Layer

The conductivity variable layer used for the organic EL element of the present invention is provided as a film of the above-mentioned conductivity variable composition, having the above-mentioned conductive pattern and insulating pattern. Such a conductivity variable layer may be same as the conductivity variable layer, the conductive pattern and the insulating pattern explained in the above-mentioned "B. Conductivity variable laminated body" and "C. Conductive pattern formed body".

Here, according to the present invention, it is preferable that the conductivity variable layer contains a binder to have the contact angle decline with respect to a liquid by the action of the photocatalyst accompanied by the energy irradiation as mentioned above. Thereby, the conductive pattern has the wettability decline compared with the insulating pattern so that the organic EL layer to be described later can be formed highly precisely on the conductive pattern, by utilizing the wettability difference.

It is preferable that the conductive pattern of the conductivity variable layer has the wettability of a 9° or less contact angle with respect to a liquid of 40 mN/m surface tension; preferably 10° or less contact angle with respect to a liquid of 50 mN/m surface tension; and particular preferably 10° or less contact angle with respect to a liquid of 60 mN/m surface tension. In the case the contact angle with respect to a liquid of the conductive pattern, that is, in the lyophilic region is high, spreading of the organic EL layer forming coating solution may be poor in this portion at the time of forming the organic EL layer to be described later so that a problem of lacking of the organic EL layer, in particular, of the light emitting layer, or the like may be generated.

On the other hand, in the insulating pattern, that is, in the liquid repellent region, it is preferable to have the wettability of a 10° or more contact angle with respect to a liquid of 40 mN/m surface tension; preferably 10° or more contact angle with respect to a liquid of 30 mN/m surface tension; and particular preferably 10° or more contact angle with respect to a liquid of 20 mN/m surface tension. Since the liquid repellent property is required to the insulating pattern, in the case the contact angle with respect to a liquid is small, due to the insufficiency of the liquid repellent property, the patterning characteristic may be deteriorated at the time of forming the organic EL layer.

The contact angle with respect to a liquid here is obtained from the results or a graph of the results of measuring (30 seconds after of dropping liquid droplets from a micro syringe) the contact angle with respect to liquids having various surface tensions using a contact angle measuring device (CA-Z type manufactured by Kyowa Interface Science, Co., Ltd). Moreover, at the time of the measurement, as the liquids having the various surface tensions, wetting index standard solution manufactured by JUNSEI CHEMICAL CO., LTD. were used.

Moreover, it is preferable that the thickness of such a conductivity variable layer is 10 nm to 1,000 nm; more preferably, it is 10 nm to 500 nm; and particular preferably it is in a range of 10 nm to 200 nm. In the case the conductivity variable layer is too thin, it may be difficult to realize the conductivity in the above-mentioned conductive pattern or change the wettability. On the other hand, in the case the conductivity variable layer is too thick, transportation of the hole or the electron may be inhibited so as to cast an adverse effect to the electric characteristic of the organic EL element.

2. Organic EL Layer

The organic EL layer used in the present invention comprises one layer or a plurality of organic layers including at least a light emitting layer. That is, the organic EL layer is a layer including at least a light emitting layer, with the layer configuration of one organic layer or more. In general, in the case the organic EL layer is formed with the wet process by coating, since the lamination of a large number of layers is difficult according to the relationship with the solvent, it is formed as one layer or two layers of organic layers in many cases. However, it is also possible to provide a larger number of layers by skillfully using the organic material or employing the vacuum deposition method in a combination.

As the organic layers formed in the organic EL layer in addition to the light emitting layer, a charge injecting layer such as a hole injecting layer and an Electron injecting layer can be presented. Furthermore, as the other organic layers, a charge transporting layer such as a hole transporting layer for transporting the hole to the light emitting layer, and an electron transporting layer for transporting the electron to the light emitting layer can be presented. In general, these layers can be provided integrally with the charge injecting layer by providing the charge transporting function to the charge injecting layer. Additionally, as the organic layer formed in the organic EL layer, a layer for preventing piercing of the hole or the electron for improving the rebinding efficiency such as a carrier block layer can be presented.

In the present invention, as mentioned above, since the conductivity variable layer has the hole injecting property and the hole transporting property, the conductivity variable layer may also play the role, for example, of a hole injecting layer, a hole transporting layer, or a hole injecting and transporting layer as a single layer having the both functions of the hole injecting function and the hole transporting function. Therefore, as the organic EL layer, the hole injecting layer, the hole transporting layer, or the single hole injecting and transporting layer having the hole injecting function and the hole transporting function need not be provided.

Hereinafter, each configuration of such an organic EL layer will be explained.

(1) Light Emitting Layer

As the light emitting layer as the essential configuration of the organic EL layer in the present invention, for example, a light emitting material such as a pigment based light emitting material, a metal complex based light emitting material, and a polymer based light emitting material can be used.

As the pigment based light emitting material, for example, a cyclopentadiene derivative, a tetraphenyl butadiene derivative, a triphenyl amine derivative, an oxadiazol derivative, a pyrazoloquinoline derivative, a distyryl benzene derivative, a distyryl arylene derivative, a silol derivative, a thiophene ring compound, a pyridine ring compound, a perynon derivative, a perylene derivative, an oligothiophene derivative, a triphmanyl amine derivative, an oxadiazol dimer, a pyrazoline dimer or the like can be presented.

Moreover, as the metal complex based light emitting material, for example, metal complexes having an Al, a Zn, a Be or the like as the central metal, or a rare earth metal such as a Tb, an Eu, a Dy or the like, and an oxadiazol, a thiadiazol, a phenyl pyridine, a phenyl benzoimidazol, a quinoline structure or the like as the ligand, such as an aluminum quinolinol complex, a benzoquinolinol beryllium complex, a benzoxazol zinc complex, a benzothiazol zinc complex, an azomethyl zinc complex, a porphiline zinc complex, an europium complex or the like can be presented.

Furthermore, as the polymer based light emitting material, for example, a polyparaphenylene vinylene derivative, a polythiophene derivative, a polyparaphenylene derivative, a polysilane derivative, a polyacetylene derivative, a polyvinyl carbazol or the like, a polyfluolene derivative, a polyquinoxaline derivative, a polymer thereof or the like can be presented.

For the purpose of improving the light emitting efficiency, changing the light emitting wavelength or the like, an additive such as a doping agent may be added into the light emitting layer. As such a doping agent, for example, a perylene derivative, a coumarin derivative, a rubrene derivative, a quinacridone derivative, a squalium derivative, a porphiline derivative, a styryl based pigment, a tetracene derivative, a pyrazoline derivative, a decacyclene, a phenoxazone, a quinoxaline derivative, a carbazol derivative, and a fluolene derivative can be presented.

The thickness of the light emitting layer is not particularly limited as long as it is a thickness capable of providing the field for rebinding of the electron and the hole so as to provide the light emitting function. For example it can be about 1 nm to 500 nm.

The method for forming the light emitting layer is not particularly limited, and thus it may be a common method for forming a light emitting layer, such as the photolithography method, the printing method or the like. Moreover, as mentioned above, in the case the contact angle with respect to a liquid of the above-mentioned conductive pattern is lower than the contact angle with respect to a liquid of the insulating pattern, it may be formed by coating a light emitting layer forming coating solution containing the above-mentioned materials onto the conductive pattern. The method for coating such light emitting layer forming coating solution is not particularly limited as long as it is a method capable of coating onto the above-mentioned characteristic change pattern layer, and it is preferably a method capable of forming the light emitting layer evenly and highly precisely. As such a coating method, for example, a dip coating method, a roll coating method, a blade coating method, a spin coating method, a micro gravure coating method, a gravure coating method, a bar coating method, a wire bar coating method, a casting method, an ink jet method, a LB method, a flexo printing method, an offset printing method, a screen printing method or the like can be presented.

In the present invention, as mentioned above, in the case the conductivity variable layer also plays the role of the hole injecting layer, the hole transporting layer or the hole injecting and transporting layer comprising a single layer having the hole injecting function and the hole transporting function, it is preferable to form a light emitting layer in a pattern as the organic EL layer on the conductivity variable layer. Since the light emitting layer is formed in a pattern so as to provide the light emitting layers of the three colors of red, green and blue, an organic EL element capable of providing the color display can be obtained.

(2) Charge Injecting and Transporting Layer

In the present invention, the charge injecting and transporting layer may be formed between the electrode layer or the counter electrode layer and the light emitting layer. The charge injecting and transporting layer here has the function of stably transporting the charge from the electrode layer or the counter electrode layer to the light emitting layer. By providing such charge injecting and transporting layer between the light emitting layer and the electrode layer or the counter electrode layer, the charge injection to the light emitting layer can be stabilized so as to improve the light emitting efficiency.

As such charge injecting and transporting layer, there are a hole injecting and transporting layer for transporting the hole injected from the anode into the light emitting layer, and an electron injecting and transporting layer for transporting the electron injected from the cathode into the light emitting layer. Hereinafter, the hole injecting and transporting layer and the electron injecting and transporting layer will be explained.

(i) Hole Injecting and Transporting Layer

The hole injecting and transporting layer used in the present invention may be one of the hole injecting layer for injecting the hole into the light emitting layer or the hole transporting layer for transporting the hole, a lamination of the hole injecting layer and the hole transporting layer, or a single layer having the both functions of the hole injecting function and the hole transporting function.

In the present invention, since the electrode layer of the base material is in general an anode, the hole injecting and transporting layer is formed between the light emitting layer and the electrode layer.

The material used for the hole injecting and transporting layer is not particularly limited as long as it is a material capable of stably transporting the hole injected from the anode into the light emitting layer. In addition to the compounds presented for the light emitting material, phenyl amine based, star burst type amine based, or phthalocyanine based, oxides such as a vanadium oxide, a molybdenum oxide, a ruthenium oxide, an aluminum oxide, a titanium oxide, an amorphous carbon, a polyaniline, a polythiophene, a polyphenylene vinylene derivative or the like can be used. Specifically, a bis(N-(1-naphthyl-N-phenyl) benzidine (α-NPD), a 4,4,4-tris(3-methyl phenyl phenyl amino) triphenyl amine (MTDATA), a poly 3,4 ethylene dioxythiophene-polystyrene sulfonic acid (PEDOT-PSS), a polyvinyl carbazol (PVCz) or the like can be presented.

Moreover, the thickness of the hole injecting and transporting layer is not particularly limited as long as it is a thickness capable of sufficiently performing the function of injecting the hole from the anode and transporting the hole to the light emitting layer. Specifically, it is in a range of 0.5 nm to 1,000 nm, in particular it is preferably in a range of 10 nm to 500 nm.

(ii) Electron Injecting and Transporting Layer

The Electron injecting and transporting layer used in the present invention may be one of the electron injecting layer for injecting the electron into the light emitting layer or the electron transporting layer for transporting the electron, a lamination of the electron injecting layer and the electron transporting layer, or a single layer having both functions of the electron injecting function and the electron transporting function.

In the present invention, since the counter electrode layer is in general a cathode, the electron injecting and transporting layer is formed between the light emitting layer and the counter electrode layer.

The material used for the electron injecting layer is not particularly limited as long as it is a material capable of stabilizing the electron injecting into the light emitting layer. In addition to the compounds presented for the light emitting material of the light emitting layer, alkaline metals such as an aluminum lithium alloy, a lithium fluoride, a strontium, a magnesium oxide, a magnesium fluoride, a strontium fluoride, a calcium fluoride, a barium fluoride, an aluminum oxide, a strontium oxide, a calcium, a polymethyl methacrylate, a sodium polystyrene sulfonate, a lithium, a cesium, and a cesium fluoride, halides of the alkaline metals, organic complexes of the alkaline metals, or the like can be used.

The thickness of the electrode injecting layer is not particularly limited as long as it is a thickness capable of sufficiently performing the electron injecting function.

Moreover, the material used for the electron transporting layer is not particularly limited as long as it is a material capable of transporting the electron injected from the electrode layer or the counter electrode layer into the light emitting layer. For example, a bathcuproine, a bathphenanthroline, a phenanthroline derivative, a triazol derivative, an oxadiazol derivative, a tris(8-quinolinolato) aluminum complex ($Alq_3$) or the like can be presented.

The thickness of the electron transporting layer is not particularly limited as long as it is a thickness capable of sufficiently performing the electron transporting function.

Furthermore, as the electron injecting and transporting layer comprising a single layer having both functions of the electron injecting function and the electron transporting function, a metal doping layer with an alkaline metal or an alkaline earth metal doped to an electron transporting organic material may be formed so as to provide the electron injecting and transporting layer. As the electron transporting organic material, for example, a bathcuproine, a bathphenanthroline, a phenanthroline derivative or the like can be presented. As the doping metal, a Li, a Cs, a Ba, a Sr or the like can be presented.

The thickness of the electron injecting and transporting layer comprising a single layer is not particularly limited as long as it is a thickness capable of sufficiently performing the electron injecting function and the electron transporting function.

3. Base Material

Next, the base material used for the organic EL element of the present invention will be explained. The base material used in the present invention may be one with the electrode layer and the insulation layer formed on the base material as explained in the item of the base material of the above-mentioned "B. Conductivity variable laminated body". The electrode layer formed on such a base material may either be an anode or a cathode, however, it is in general formed as an anode.

Moreover, the electrode layer may either be transparent or not, and it may be selected optionally according to the light taking out surface or the receiving surface or the like. For example in the case of taking out the light beam from the electrode layer side of the organic EL element of the present invention, the electrode layer needs to be transparent or semi-transparent.

As the anode, it is preferable to use a conductive material having a large work function for facilitating the hole injection. Specifically, a metal having a large work function such as an ITO, an indium oxide, and a gold, a conductive polymer such as a polyaniline, a polyacetylene, a polyalkyl thiophene derivative, and a polysilane derivative, or the like can be presented.

Moreover, it is preferable that the electrode layer has a small resistance. In general, a metal material is used, however, an organic compound or an inorganic compound may be used as well.

As for the method of forming such electrode layer, a conventional forming method of the electrode can be employed. For example, PVD method such as vacuum deposition method, sputtering method, or ion plating method, or CVD method can be cited. For a patterning method of the electrode layer, there is no particular limitation imposed as long as a desired pattern can be formed precisely, however, photolithography method or the like can be cited as a specific example.

The insulation layer mentioned above is formed between the electrode layers formed in a pattern. In general, the insulation layer is formed so as to cover the end parts of the electrode layer.

The insulation layer is provided for stopping the charge supply from the electrode layer to the organic EL layer. Moreover, the portion with the insulation layer formed can be a portion without the light emission.

For such insulation layer, a photo setting resin such as a photosensitive polyimide resin and an acrylic based resin, a thermosetting resin, an inorganic material, or the like can be used.

Moreover, for a forming method of the insulation layer, those methods known in general, such as the photolithography method or the printing method, can be employed.

4. Organic EL Element

The organic EL element of the present invention is not particularly limited as long as it comprises the conductivity variable layer having the above-mentioned base material, the conductive pattern and the insulating pattern, and the above-mentioned organic EL layer. As needed, it may optionally comprise another layer. In the present invention, in general a counter electrode layer is formed on the above-mentioned organic EL layer. Hereinafter, such a counter electrode layer will be explained.

(Counter Electrode Layer)

The counter electrode layer used in the present invention is formed on the organic EL layer and faces the electrode layer. The counter electrode layer used in the present invention may either be an anode or a cathode, but in general it is formed as a cathode.

Moreover, the counter electrode layer may either be transparent or not, and it may be selected optionally according to the light taking out surface, the light receiving surface or the like. For example, in the case of taking out a light beam from the counter electrode layer side, the counter electrode layer needs to be transparent or semitransparent.

For the cathode, it is preferable to use a conductive material having a small work function for facilitating the electron injection. For example, magnesium alloys such as a MgAg, aluminum alloys such as an AlLi, an AlCa, and an AlMg, alkaline metals and alkaline earth metals such as a Li and a Ca, alloys of the alkaline metals and the alkaline earth metals, or the like can be presented.

Moreover, it is preferable that the counter electrode layer has a small resistance. In general, a metal material is used, but an organic compound or an inorganic compound may be used as well.

As for the other points of the counter electrode layer, they are same as the ones of the electrode layer formed the base material mentioned above. Thus, an explanation is omitted here.

The present invention is not limited to the embodiments. The embodiments are merely examples, and any one having the substantially same configuration as the technological idea disclosed in the claims of the present invention and the same effects is included in the technological scope of the present invention.

EXAMPLE

Hereinafter, the present invention will be explained further specifically with reference to the examples.

At a room temperature, 5 parts by weight of a pyrocarbonate dibutyl produced by Tokyo Chemical Industry Co., Ltd. dissolved in a minute amount of a tetrahydro furan produced by KANTO KAGAKU. and 95 parts by weight of a solid component of a silver colloid produced by NIPPON PAINT Co., Ltd. were agitated for 12 hours. Thereafter, by eliminating a minute amount of unnecessary precipitates and aggregates by the filtration under reduced pressure, a silver dispersion treated with the dibutoxy carbonyl was obtained.

By gradually adding a titanium oxide coating solution (TKS-201) produced by ISHIHARASANGYOKAISHA, LTD. to the silver dispersion while agitating the dispersion so as to have a 2:8 weight ratio by the solid component ratio, and furthermore, eliminating a minute amount of unnecessary precipitates and aggregates by the filtration under reduced pressure, a desired conductivity variable material was obtained.

By coating the above-mentioned solution on a washed glass substrate by a spin coating method for forming a film, and drying on a 130° C. hot plate for 30 minutes, an 80 nm film thickness conductivity variable layer was provided.

The surface resistance measurement was carried out for the conductivity variable layer before the exposure using Hiresta HT-210 produced by Mitsubishi Chemical Corporation with a 10 V applied voltage, a high resistance value of more than the measurement limit ($1.0 \times 10^{13} \Omega$ or more) was confirmed.

After directing an ultraviolet ray by 2.5 J/m$^2$ to the above-mentioned conductivity variable layer with a UV irradiating device, the surface resistance value was measured in the same manner. As a result, a $1.8 \times 10^9 \Omega$ resistance value was obtained so as to confirm that the resistance value was lowered (conductivity improvement) by the ultraviolet ray irradiation.

What is claimed is:

1. A conductivity variable composition comprising:
   an insulating particle including a conductive inorganic material, and an organic material having no conductivity and adhered on a circumference of the conductive inorganic material; and
   an anatase type titanium oxide,
wherein the conductive inorganic material is nickel, gold, silver, copper, aluminum, zinc, cobalt, tin and an alloy thereof; the organic material is pyrocarbonate dibutyl, triethyl amine, acetyl acetone, or pentane thiol; and the conductivity variable composition realizes conductivity by an energy irradiation.

* * * * *